(12) United States Patent
Cheon et al.

(10) Patent No.: US 9,122,592 B2
(45) Date of Patent: *Sep. 1, 2015

(54) FLASH MEMORY DEVICE WITH MULTI-LEVEL CELLS AND METHOD OF WRITING DATA THEREIN

(71) Applicant: SAMSUNG ELECTRONICS CO., LTD., Suwon-Si, Gyeonggi-Do (KR)

(72) Inventors: Won-Moon Cheon, Hwaseong-si (KR); Seon-Taek Kim, Suwon-si (KR); Chan-Ik Park, Seoul (KR); Sung-up Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/479,472

(22) Filed: Sep. 8, 2014

(65) Prior Publication Data

US 2014/0379970 A1    Dec. 25, 2014

Related U.S. Application Data

(63) Continuation of application No. 13/777,816, filed on Feb. 26, 2013, now Pat. No. 8,843,699, and a continuation of application No. 13/406,862, filed on Feb. 28, 2012, now abandoned, and a continuation of application No. 13/110,572, filed on May 18, 2011, now abandoned, and a continuation of application No. 11/702,573, filed on Feb. 6, 2007, now Pat. No. 7,970,981.

(30) Foreign Application Priority Data

Oct. 30, 2006    (KR) .................. 10-2006-0105692

(51) Int. Cl.
*G06F 12/06*      (2006.01)
*G11C 16/04*      (2006.01)
*G06F 12/02*      (2006.01)

(52) U.S. Cl.
CPC .... *G06F 12/0246* (2013.01); *G06F 2212/7208* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 5,737,599 A | 4/1998 | Rowe et al. | |
| 6,018,789 A * | 1/2000 | Sokolov et al. | ............... 711/129 |
| 6,363,009 B1 | 3/2002 | Fukuzumi | |
| 6,456,528 B1 | 9/2002 | Chen | |
| 6,938,116 B2 | 8/2005 | Kim et al. | |
| 7,873,885 B1 * | 1/2011 | Shin et al. | ..................... 714/724 |
| RE42,398 E * | 5/2011 | Tanaka et al. | ................. 711/103 |
| 7,970,981 B2 | 6/2011 | Cheon et al. | |

(Continued)

FOREIGN PATENT DOCUMENTS

| | | | |
|---|---|---|---|
| JP | 2000173281 A | 6/2000 | |
| JP | 2001006374 | 1/2001 | |

(Continued)

*Primary Examiner* — Daniel Bernard
(74) *Attorney, Agent, or Firm* — Volentine & Whitt, PLLC

(57) ABSTRACT

In one aspect, a method of writing data in a flash memory system is provided. The flash memory system forms an address mapping pattern according to a log block mapping scheme. The method includes determining a writing pattern of data to be written in a log block, and allocating one of SLC and MLC blocks to the log block in accordance with the writing pattern of the data.

15 Claims, 16 Drawing Sheets

(56) References Cited

U.S. PATENT DOCUMENTS

| | | | |
|---|---|---|---|
| 8,677,058 B2* | 3/2014 | Jung et al. | 711/103 |
| 2002/0099904 A1 | 7/2002 | Conley | |
| 2003/0065876 A1* | 4/2003 | Lasser | 711/103 |
| 2003/0084233 A1 | 5/2003 | Williams | |
| 2004/0059869 A1* | 3/2004 | Orsley | 711/114 |
| 2004/0205290 A1* | 10/2004 | Shinagawa et al. | 711/103 |
| 2004/0267787 A1 | 12/2004 | Huras | |
| 2004/0268063 A1* | 12/2004 | Lasser | 711/103 |
| 2005/0144367 A1* | 6/2005 | Sinclair | 711/103 |
| 2006/0259718 A1* | 11/2006 | Paley | 711/103 |
| 2006/0285397 A1* | 12/2006 | Nishihara et al. | 365/185 |
| 2007/0283086 A1* | 12/2007 | Bates | 711/113 |
| 2008/0034174 A1* | 2/2008 | Traister et al. | 711/103 |
| 2008/0301256 A1 | 12/2008 | McWilliams et al. | |
| 2008/0307152 A1* | 12/2008 | Nakanishi et al. | 711/102 |
| 2011/0138110 A1* | 6/2011 | Liu | 711/103 |
| 2013/0282955 A1* | 10/2013 | Parker et al. | 711/103 |

FOREIGN PATENT DOCUMENTS

| | | |
|---|---|---|
| JP | 2001306393 | 11/2001 |
| JP | 2002366423 | 12/2002 |
| JP | 2003015946 | 1/2003 |
| JP | 2005503640 | 2/2005 |
| KR | 100389867 A | 7/2003 |
| KR | 1020040047835 A | 6/2004 |
| KR | 1020060021099 | 3/2006 |

* cited by examiner (1) Randomly writing to B1(Overwriting pattern)

(2) Copying valid page to B2

(3) Randomly writing to B2(Overwriting pattern)

(4) Copying valid page to B1 after erasing B1

FLASH MEMORY DEVICE WITH MULTI-LEVEL CELLS AND METHOD OF WRITING DATA THEREIN

CROSS-REFERENCE TO RELATED APPLICATIONS

This is a continuation of application Ser. No. 13/777,816, filed Feb. 26, 2013, which is a continuation of abandoned application Ser. No. 13/406,862, filed Feb. 28, 2012, which is a continuation of abandoned application Ser. No. 13/110,572, filed May 18, 2011, which is a continuation of application Ser. No. 11/702,573, filed Feb. 6, 2007, which issued as U.S. Pat. No. 7,970,981, on Jun. 28, 2011, and which claims priority under 35 U.S.C. §119 to Korean Patent Application No. 10-2006-0105692, filed Oct. 30, 2006, the entire contents of which are hereby incorporated by reference.

BACKGROUND

The present invention generally relates to flash memory devices, and more particularly, the present invention relates to address mapping techniques for flash memory devices.

In an effort to increase storage capacity, flash memory devices have been developed in which each flash cell is capable of storing two or more bits. These types of multi-bit memory devices are typically referred to as "multi-level cell" or "MLC" devices. In contrast, flash memory devices storing 1-bit data per memory cell are typically referred to a "single-level cell" or "SLC" devices. When compared to SLC flash memory devices, MLC flash memory devices offer the advantage of increased storage capacity, but suffer the disadvantage of increased write times. In addition, there have been relatively recent proposals relating to hybrid NAND flash memories which selectively utilize memory cells in either MLC or SLC modes.

In flash memories, each unit memory cell must be in an erased state prior to programming In addition, erase functions are typically executed in units of erase blocks or erase zones containing large quantities of memory cells. These and other characteristics of flash memory necessitate the use of a "flash translation layer" (FTL) between the flash memory and the file system of the device. FTL generally functions to conceal the erase operations of the flash memory, and to emulate a storage device such as a disc drive or other mass-storage device. For example, during a write operation, the FTL functions to map physical addresses of the flash memory with logical addresses generated by the file system. In order to achieve a fast mapping operation, FTL uses an address mapping table typically composed of static random access memory (RAM).

One type of FTL includes log block mapping scheme. Generally, log block mapping utilizes log blocks as write buffers. This address mapping function of FTL allows a host to identify flash memory as a hard disk drive (HDD) or static RAM, and to access the flash memory in the same manner as an HDD or static RAM.

As suggested above, one important aspect of FTL functionality relates address mapping, and one example thereof is disclosed in U.S. Pat. No. 6,381,176 entitled 'METHOD OF DRIVING REMAPPING IN FLASH MEMORY AND FLASH MEMORY ARCHITECTURE SUITABLE THEREFOR', which is incorporated by reference.

Conventionally mapping schemes, however, are generally unsuitable or inefficient for an MLC flash memory device. In particular, writing speeds may not be desirable in the MLC flash memory device operable with conventional the log block mapping.

SUMMARY OF THE INVENTION

According to an aspect of the present invention, a method of writing data in a flash memory system is provided. The flash memory system forms an address mapping pattern according to a log block mapping scheme. The method includes determining a writing pattern of data to be written in a log block, and allocating one of SLC and MLC blocks to the log block in accordance with the writing pattern of the data.

According to another aspect of the present invention, a method of writing data in an MLC flash memory system is provided. The flash memory system forms an address mapping pattern according to a log block mapping scheme. The method includes determining a writing pattern of data to be written in the MLC flash memory, allocating one of first and second blocks to a log block for a write buffer in accordance with the writing pattern of the data.

According to still another aspect of the present invention, a method of mapping addresses in a flash memory system is provided. The flash memory system forms an address mapping pattern in accordance with a log block mapping scheme. The method includes including a plurality of SLC blocks in a log block, and using an MLC block for a data block corresponding to the log block.

According to yet another aspect of the present invention, a method of writing data in a flash memory system is provided. The flash memory system forms an address mapping pattern in accordance with a log block mapping scheme. The method includes allocating at least first and second blocks to a log block, writing the data into the first block, determining a size of valid pages of the first block, copying data of the valid pages into the second block, writing the data into the second block, and determining a size of valid pages of the second block.

According to another aspect of the present invention, a memory system is provided which forms an address mapping pattern on accordance with a log block mapping scheme. The memory system includes a flash memory device including pluralities of SLC and MLC blocks as storage fields, and a controller which detects a writing pattern of externally supplied data and which selects a part of the SLC blocks or one of the plural MLC blocks as a log block in accordance with the detected writing pattern.

BRIEF DESCRIPTION OF THE FIGURES

Non-limiting and non-exhaustive embodiments of the present invention will be described with reference to the accompanying figures, wherein like reference numerals refer to like parts throughout the various figures unless otherwise specified. In the figures.

DETAILED DESCRIPTION OF PREFERRED EMBODIMENTS

Figure 1A:
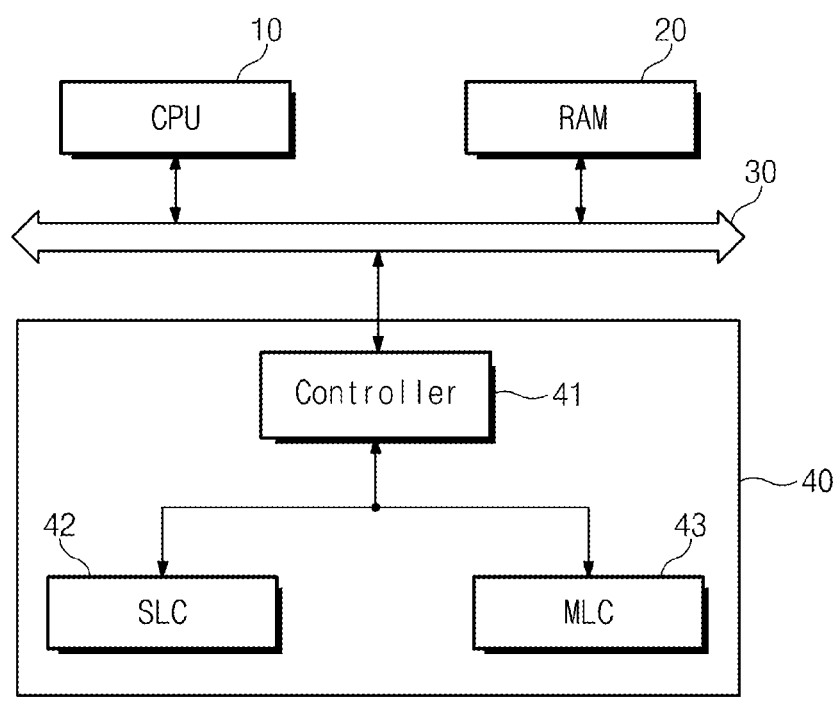
FIG. 1A is a block diagram illustrating a flash memory system according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

FIG. 1A is a block diagram illustrating a flash memory system which includes an SLC block and an MLC block according to an embodiment of the present invention. As shown, the system includes a central processing unit (CPU) 10, a random access memory (RAM) 20, a system bus 30, and a flash memory device 40. The flash memory device 40 includes a controller 41 which interfaces with the bus system 30, an SLC block 42, and an MLC block 43.

A log block mapping scheme is formed by the CPU 10, the RAM 20, and the flash memory device 40. An FTL (flash translation layer) that maps logical addresses present on the bus system 30 to physical addresses of the SLC block 42 and MLC block 43 may be constituted by the flash memory controller 41 of the flash memory device 40.

Figure 1B:
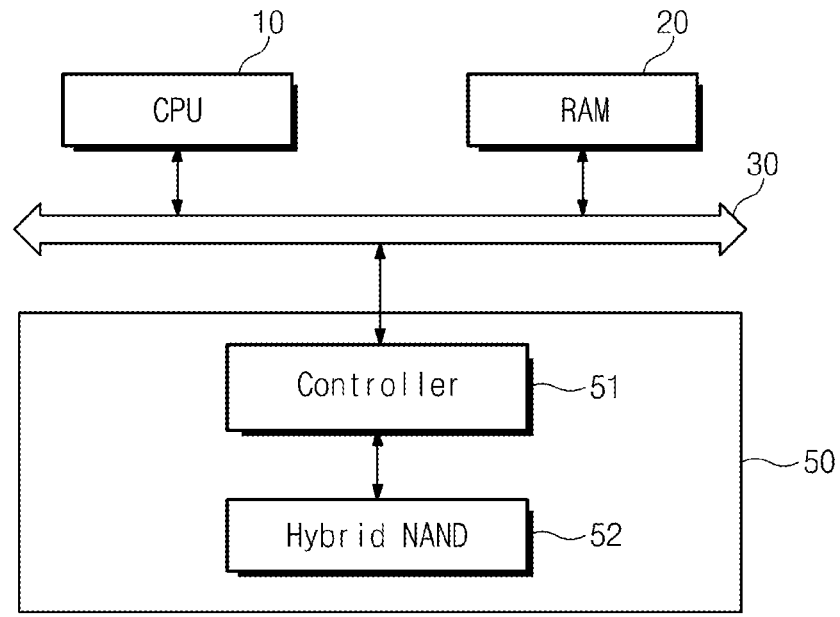
FIG. 1B is a block diagram illustrating a system equipped with a hybrid flash memory device according to an embodiment of the present invention.

FIG. 1B is a block diagram illustrating a system equipped with a hybrid NAND flash memory block according to another embodiment of the present invention. In this example, the system includes a central processing unit (CPU) 10, a random access memory (RAM) 20, a system bus 30, and a flash memory device 50. Here, the flash memory device 50 includes a controller 51 which interfaces with the bus system 30, and a hybrid NAND flash memory 50 which includes memory cells usable as either SLC cells or MLC cells. That is, the hybrid flash memory 50 may be operable in an SLC mode which is capable of conducting relatively fast writing and reading operations, or in an MLC mode which is capable of larger quantities of data but at lower operating speeds. Like the embodiment of FIG. 1A, an FTL that maps logical addresses present on the bus system 30 to physical addresses of the hybrid NAND memory 52 may be constituted by the flash memory controller 51.

Figure 2A:
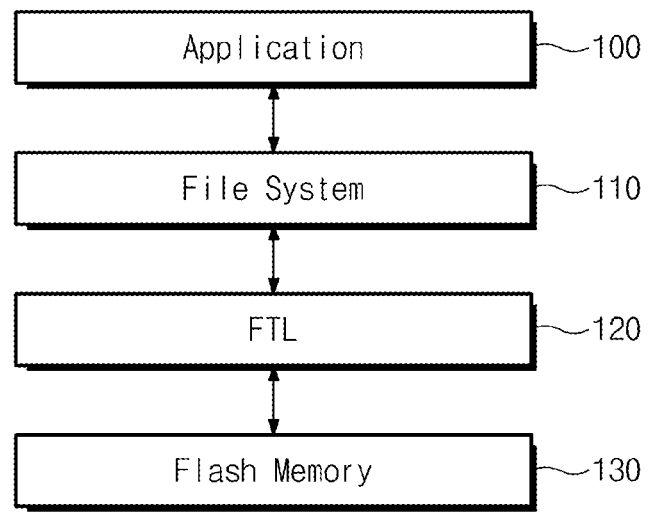
FIG. 2A is a block diagram illustrating a layer structure of software for driving the systems shown in FIGS. 1A and 1B.

FIG. 2A is a block diagram illustrating an FTL software structure for driving the systems shown in FIGS. 1A and 1B. Referring to FIG. 2A, the FTL 120 conducts address translation for writing and reading operations in the flash memory 130 with parameters of logical addresses (e.g., sector addresses and the number of sectors) transferred from an application software 100 and layers of a file system 110. The FTL 100 forms a mapping table for mapping physical addresses of the flash memory in correspondence with logical addresses.

Figure 2B:
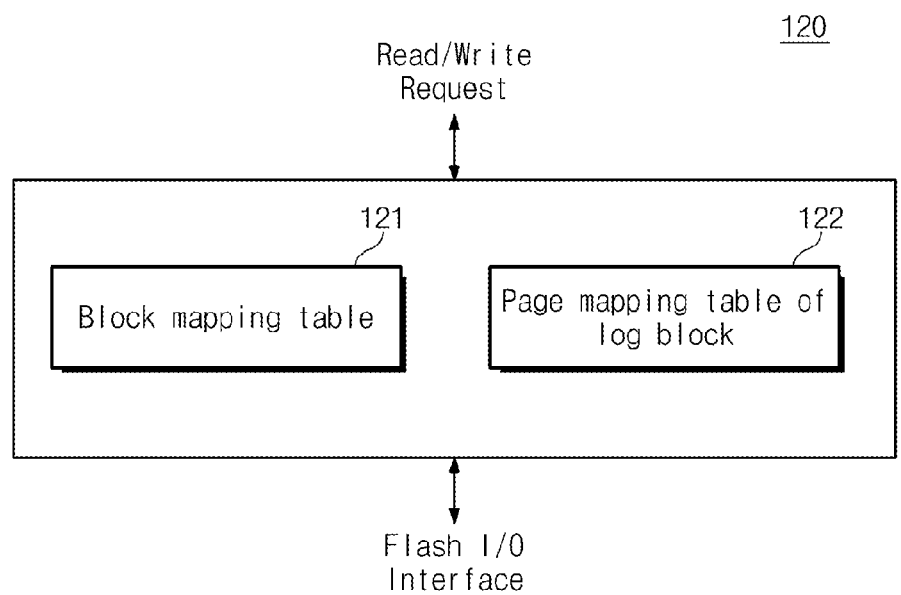
FIG. 2B is a block diagram illustrating an internal organization of the flash translation layer (FTL) shown in FIG. 2A.

FIG. 2B is a block diagram illustrating an internal organization of the FTL 120 shown in FIG. 2A. The FTL 120 in accordance with an embodiment of the present invention adopts a log block mapping scheme and includes a block mapping table 121 and a log block page mapping table 122. The log block mapping scheme basically maintains the block mapping table in response to requests for reading and writing from the file system 110. Further, the page mapping table 32 is formed restrictive to a log block used for a write buffer. According to the log block mapping scheme, data are written into a log block without just updating a block when there is a need of overwriting in compliance with a request for writing. The data written in the log lock, in need of an unused log block, are put into a merged operation with erasing the corresponding log block.

Figure 3:
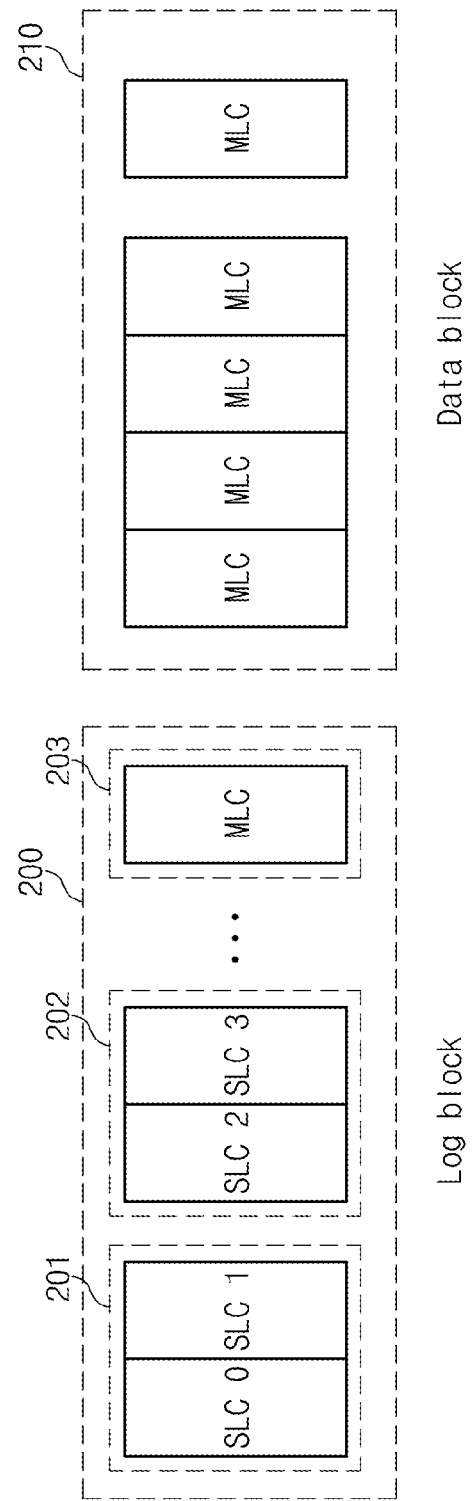
FIG. 3 is a schematic diagram for describing the allocation of a log block according to an embodiment of the present invention.

Referring to FIG. 3, blocks of the flash memory device include a log block 200, and a data block 210 into which buffering data are copied from the log block 200 by way of a merged operation.

The block assigned to the log block 200 is a block for the write buffer temporarily storing data input by a request for writing data into the data block 210. The blocks allocated to the log block 200 include SLC blocks 201 and 202. In further detail, the FTL allocates the SLC blocks 201 and 202 to the log block 200 if an offset value of a page with the logical address is not 0, i.e., a random-writing pattern (out-place order). In order to allocate the SLC blocks 201 and 202 to the log block 200, two SLC blocks forms a unit. This feature of allocation derives from the characteristics of a flash memory device which is erasable in units of blocks and readable in the units of pages. According to the aforementioned organization, it is possible to conduct a fast buffering operation because a time for writing data in the SLC block is shorter than that in the MLC block. Otherwise, when a request for writing from the file system 110 is determined as a pattern of in-place order. The FTL allocates a single MLC block 203 to the log block. In the in-place order pattern, the MLC block 203 allocated to the log block may be swapped with a data block without data copy or erasure after a sequential data storage operation.

The data block 210 is allocated with MLC blocks by means of the sequence of FTL. The log block is assigned with the SLC blocks in the random-writing pattern (out-space order) while with the MLC block in the pattern of in-place order, so that a buffering speed is enhanced, providing all functions for large-capacity storage.

According to the log block allocation, data writing speed is enhanced by means of the log block operable in faster writing and reading operations relative to the MLC mode. Further, the block allocation scheme selecting the SLC or MLC block for the log block in accordance with writing pattern (randomly or sequentially) provides the log block mapping technique optimized to each writing pattern.

Figure 4A:
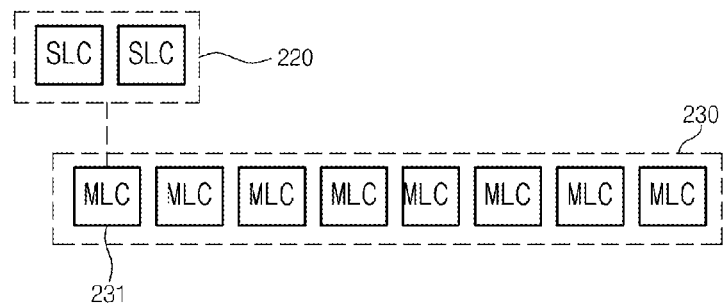
FIG. 4A is a schematic diagram for describing a 1:2 mapping scheme according to an embodiment of the present invention.
Figure 4B:
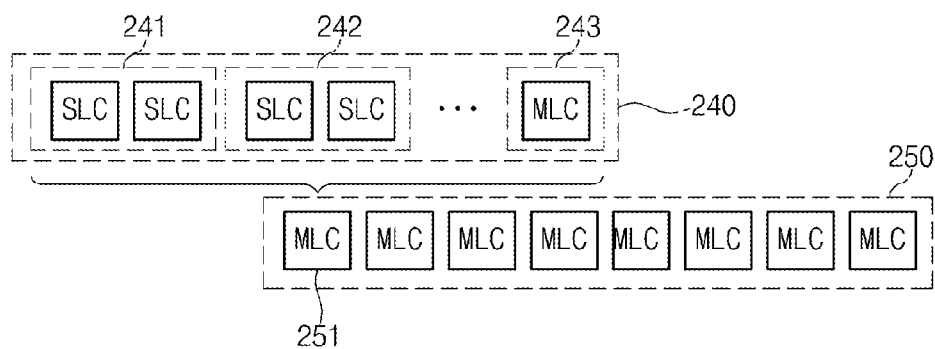
FIG. 4B is a schematic diagram for describing a 1:N mapping scheme according to an embodiment of the present invention.

FIGS. 4A and 4B schematically show embodiments of mapping physical blocks corresponding to a single logical block in accordance with embodiments of the present invention. In FIGS. 4A and 4B, there are illustrated an organization of the physical blocks allocated to the logical block by means of the log block mapping scheme.

FIG. 4A illustrates a 1:2 mapping scheme by which two SLC blocks are allocated to a log block 220, for one logical block, and an MLC block 231 is allocated to a data block. Referring to FIG. 4A, the two SLC blocks are assigned to the log block 220 for one logical block and writing data are buffered to the SLC blocks assigned to the log block 220. If all pages of the SLC blocks are filled up by the buffering operation to the log block 220, data programmed in the two SLC blocks are copied into their corresponding data block 231.

FIG. 4B is a schematic diagram illustrating a 1:N mapping scheme by which at least two or more SLC blocks and one MLC block are allocated to a log block corresponding to one logical block. Referring to FIG. 4B, one logical block is assigned with a plurality of SLC blocks 241 and 242 and one MLC block 243. The log blocks may be correspondent with a single one of the data block 251. A data buffering operation is accomplished such that the SLC blocks 241 and 242 are assigned to the log block 240 in the random-writing mode while the MLC block 243 is assigned to the log block 240 in the sequential-writing mode.

Through the mapping protocol for physical blocks corresponding to a logical block, it is possible to organize a mapping table with optimum performance for each of the random and sequential writing modes.

Figure 5:
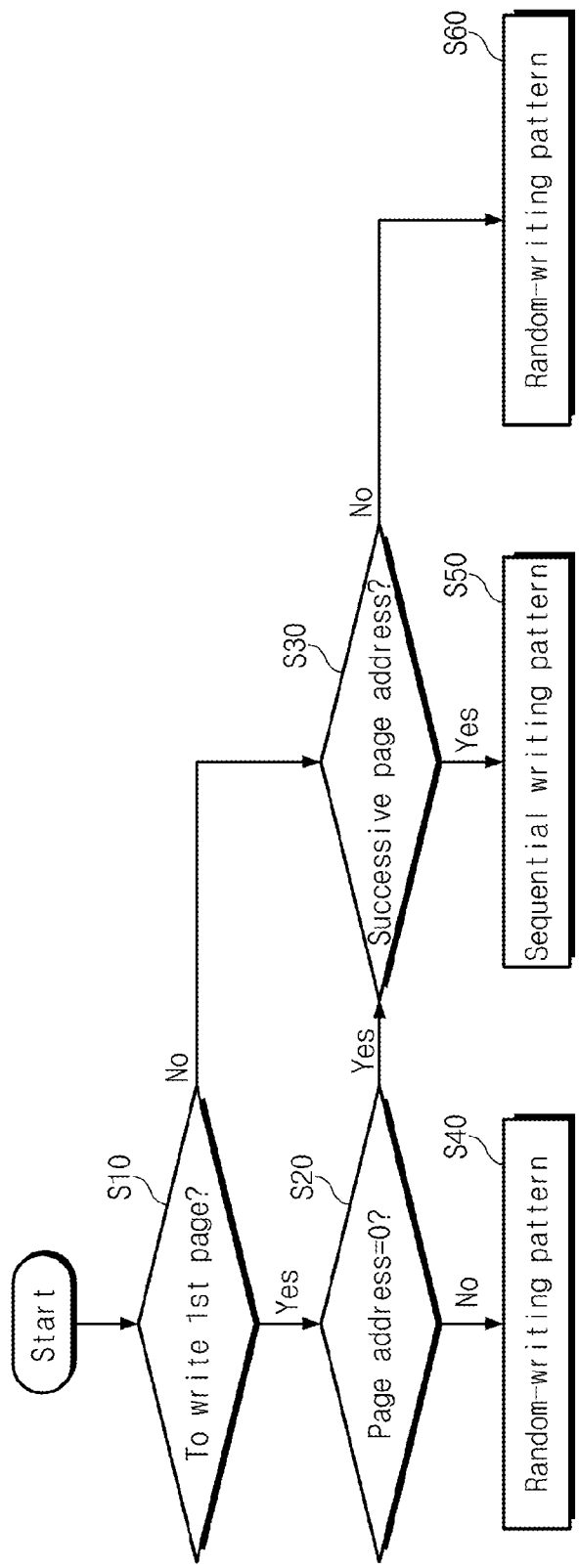
FIG. 5 is a flow chart for explaining the estimation of a writing pattern in accordance with an embodiment of the present invention.

FIG. 5 is a flow chart for explaining a procedure of estimating a writing pattern in accordance with an embodiment of the present invention. The procedure is a pattern analyzing algorithm carried out by the FTL for determining the random and sequential writing patterns. If there is a request for writing from the file system, the FTL determines a writing pattern of input data with reference to logical addresses LBN provided thereto. In particular, a pattern of a writing operation requested is determined by analyzing a pattern of page allocation on the log block.

If a request for writing is transferred from the file system 110, the FTL begins to analyze a pattern of the writing operation. A determination is made as to whether a page input according to the request for writing is a first page (S10). If an input page is the first page, an offset value of the page is determined in accordance with whether an address of the page requested for writing is a start page address "0" (S20). If an input page is not the first one, or if the start page address is "0", a determination is made as to whether the input page is successive to the previous page (S30).

If the start page address is not "0", a mode is entered for a pattern of out-space order which randomly writes data in pages (S40). If the start page address is "0", an offset value of the page requested for writing is 0, and if the page requested for writing is the first page with an offset value of 0 and successive to the next requested pages, it may be regarded as being operable in the sequential-writing pattern (in-space order) (S50). However, when the page requested for writing is not successive to the next requested pages even with the offset value of "0", it is regarded as being operable in a random-writing pattern (out-space order) (S60).

Here, the step S30 is not restrictive to a page size unit. Namely, the procedure shown in FIG. 5 is correspondent with a case where the minimum unit of the page requested for writing is one page unit, that is, 2K bytes. However, when the minimum unit of the page requested for writing is correspondent with a plurality of pages (e.g., 2K bytes×4) in accordance with trends of large storage capacity, the step S30 is determined in consideration of such a unit.

According to the aforementioned manner of analyzing a writing pattern, since page allocation on the log block means the random-writing pattern when an offset value of the page requested for writing is not 0, the number of cycles for copying pages increases during a merged operation succeeding hereinafter. In this case, a time for writing data can be shortened by allocating the SLC blocks to the log block. If the pages requested for writing are successive in order, it is the sequential-writing pattern (i.e., in-space order). In this case, the log block is assigned with the MLC block and then the allocated log block is swapped with the data block in the merged operation to be carried out later.

Figure 6:
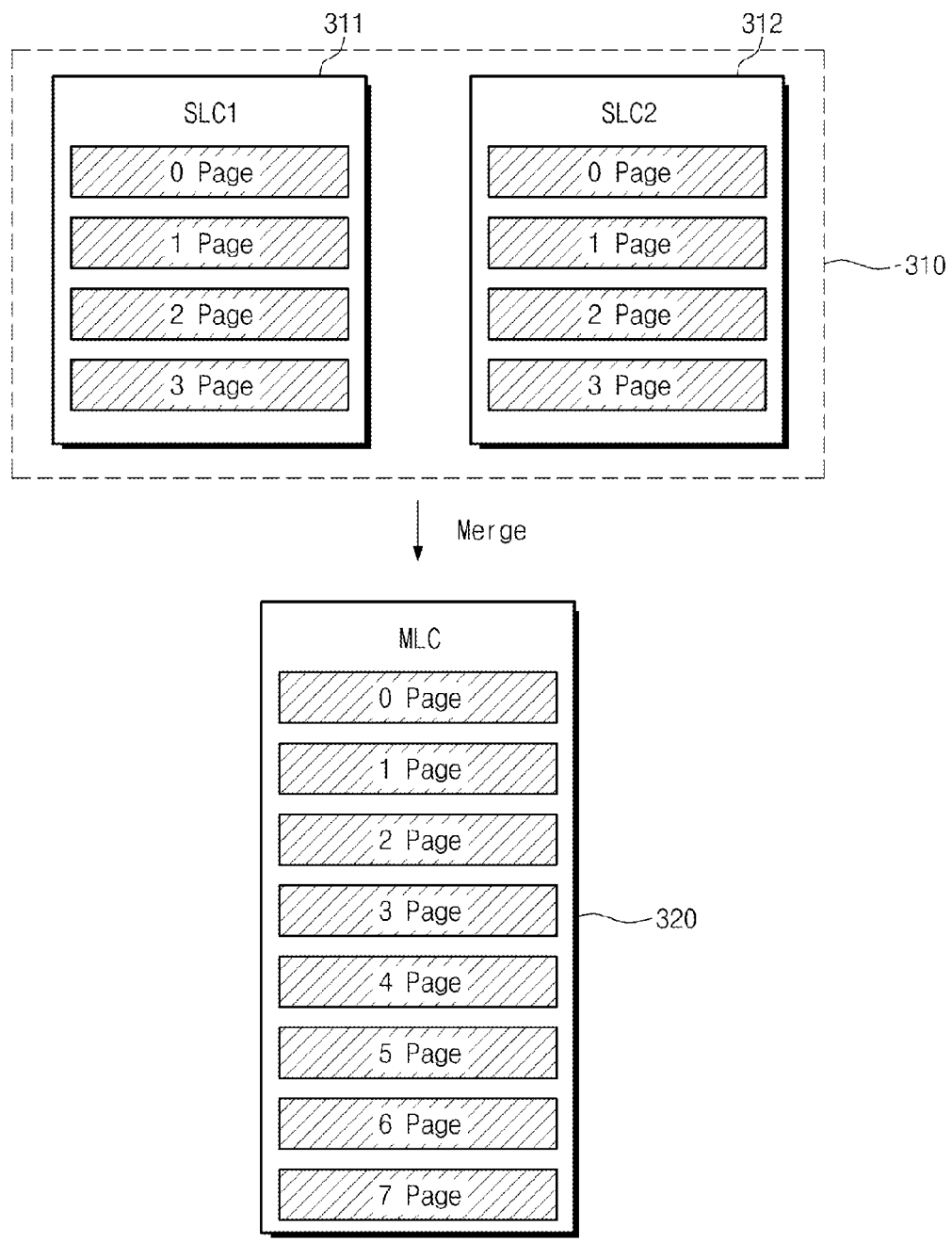
FIG. 6 is a schematic diagram for describing a merged operation in a random-writing pattern.

FIG. 6 is a schematic diagram illustrating the merged operation in a random-writing pattern after SLC block 311 and 312 of SLC1+SLC2 are allocated to a log block 310. Data programmed in the log block 310 operating as a write buffer are copied into a data block 320 in accordance with information of a mapping table. If data buffered in the log block 310 is overwritten data, only valid data finally updated are copied into the data block 320. However, the previous data except the latest page data among data programmed in the same log page are invalid data which are excluded from the merged operation. Therefore, it is possible to enhance a writing speed by assisting a rapid buffering operation through allocating the SLC blocks to the log block in the condition with repetitive overwriting operations.

Figure 7:
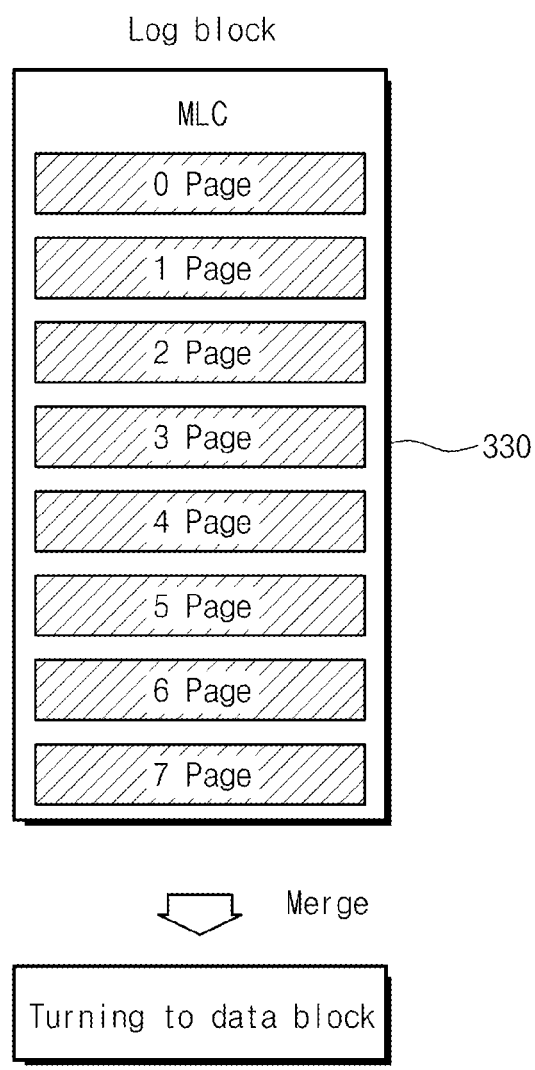
FIG. 7 is a schematic diagram for describing a merged operation in a sequential-writing pattern.

FIG. 7 is a schematic diagram illustrating the merged operation when there is a request for writing in a sequential-writing pattern (in-place order). Referring to FIG. 7, if there is a request for writing large-capacity data such as media data, an MLC block is allocated to a log block 330. Then, data requested for writing are sequentially programmed (or written) into the MLC block 330 assigned to the log block 330 for the write buffer. After completing the sequential writing operation into the log block 330, data of the log block 330 are used to swap block mapping information into the data block without a copy operation to the data block. According to the swapping operation, it is permissible to skip a merged operation for copying data into the data block from the log block and an erasing operation proceeding thereafter. Thus, the merged operation by swapping is capable of minimizing a time consumed therefor.

The aforementioned embodiment is described with respect to a flash memory device including SLC and MLC blocks, and a system including such a flash memory device. In the random-writing pattern with increasing the number of page copying cycles during the merged operation, the log block for a write buffer is allocated with the SLC blocks operable in high-frequency reading and writing functions. Even with the increasing number of page copying cycles, the flash memory device or system is able to reduce a cost for the merged operation by using the SLC block, which is operable in a high frequency relative to the MLC block, as the log block for a write buffer. Further, when there is a request for writing in the sequential pattern, the swapping operation without page copy and erasure makes it possible to conduct the merged operation and hence to allocate the MLC block with the log block for a write buffer. It is preferred to allocate the data block with the MLC blocks in order to assure maximum storage capacity. According to the allocation with the data block and the log block for a write buffer, the embodiment of the present invention offers an effective writing operation in the flash memory device capable of storing multi-bit data and including an SLC memory cell array.

Figure 8:
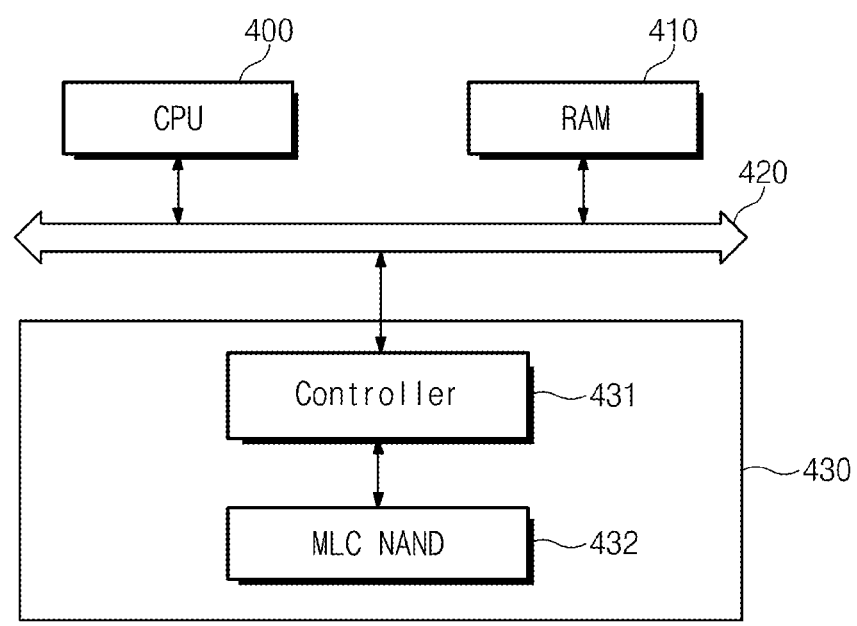
FIG. 8 is a block diagram of a flash memory system according to another embodiment of the present invention.

FIG. 8 is a block diagram of a system according to another embodiment of the present invention. In this example, the system includes a central processing unit (CPU) 400, a random access memory (RAM) 4100, a system bus 420, and a flash memory device 430. Here, the flash memory device 430 includes a controller 431 which interfaces with the bus system 420, and a MLC NAND flash memory 4320

Through the system shown in FIG. 8, the central processing unit 400, the RAM 410, and a system bus 420, a file system and an application program request the flash memory device 430 to conduct a writing operation and the FTL organizes an address mapping table for the flash memory device 430.

The flash memory device 430 is a NAND flash memory including only an MLC array 432. In this case, it is not possible to form a log block with SLC blocks that are operable in a higher frequency relative to the MLC block. Thus, a reduction of buffering speed is expected to a log block for the writing operation. However, according to a log block mapping scheme of the embodiment of the present invention, it is able to accomplish a high-frequency buffering operation even with allocating the MLC blocks to the log block. This effect arises from the log block mapping scheme, renewing a page allocation mode for the log block, although the MLC blocks are allocated to the log block. Hereinafter, the page allocation scheme for the log block will be described with reference to the accompanying figures.

Figure 9:
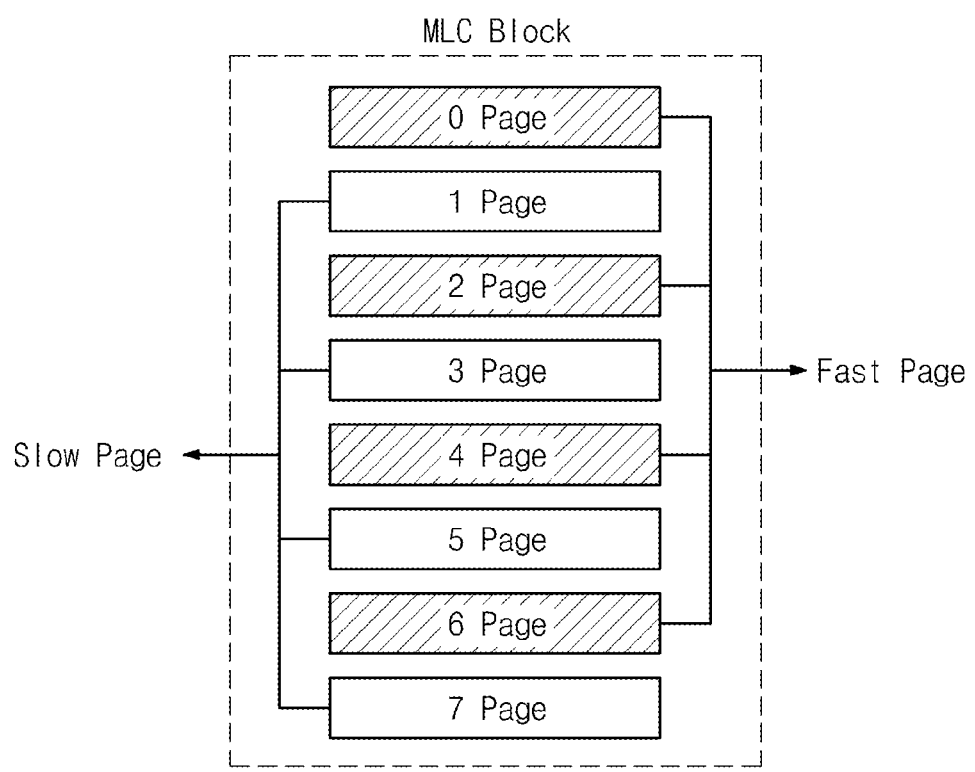
FIG. 9 is a schematic diagram for describing a page structure of the MLC block shown in FIG. 8.

FIG. 9 is a schematic diagram illustrating a structure of page allocation in the MLC block. Referring to FIG. 9, the MLC block includes fast pages operable in relatively shorter programming and reading times. Further, the MLC block also includes slow pages operable in relatively shorter programming time and reading times. The fast and slow pages are alternately arranged in the MLC block. This differential arrangement with the fast and slow pages is involved in the presence of MSB (most significant bit) and LSB (least significant bit) pages generally required of relatively long periods for writing and reading operations. For instance, in programming data in a single memory cell, it is known such that if a time for programming data into an LSB page is about 200 μs, a time for programming data into an MSB page is 800~1000 μs. Therefore, a page structure of the flash memory device in which an MSB is programmed next to an LSB may be represented as shown in FIG. 9.

Generally, in programming pages of the MLC block, an LSB page is first written prior to an MSB page. In FIG. 9, while the even-numbered pages (0, 2, 4, and 6) are assigned to the fast pages and the odd-numbered pages are assigned to the slow pages (1, 3, 5, and 7), it will not be restrictive hereto in the pattern of assignment by the embodiment of the present invention. As times for programming/reading data into/from the slow page are relatively longer, it is necessary to allocate the fast pages to effective data storage spaces in order to make the MLC blocks operate effectively as like the SLC blocks. Hereinafter, an MLC block assigned only with fast pages as being effective in storing data is referred to as a fast-half MLC block (FH MLC block).

Figure 10:
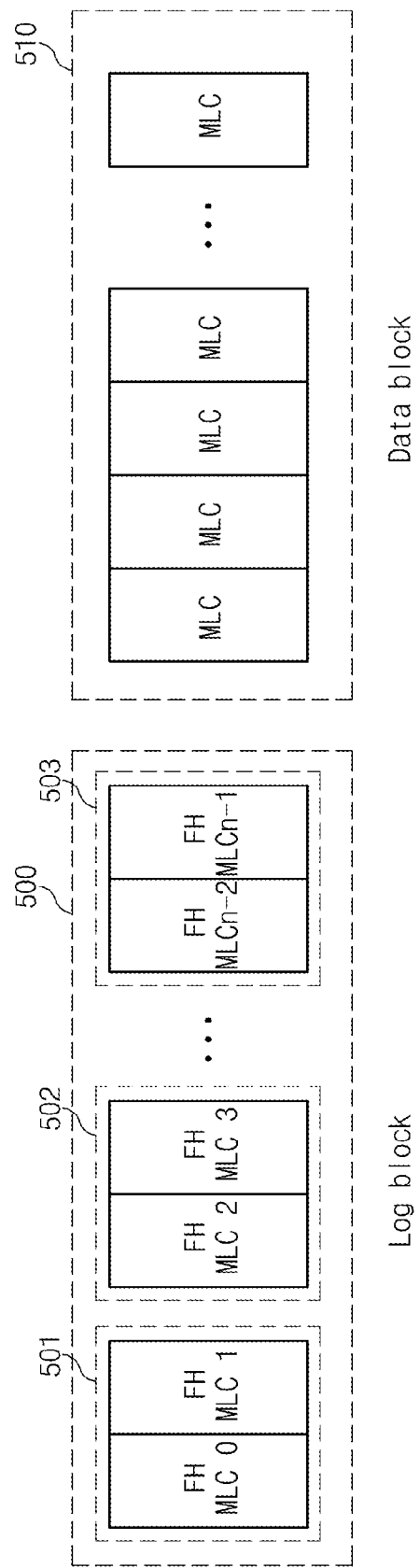
FIG. 10 is a schematic diagram for describing the allocation of a log block in the flash memory device of FIG. 8.

FIG. 10 is a schematic diagram for describing the allocation of a log block in the flash memory device including the MLC block only. According to the log block mapping scheme of an embodiment of the present invention, a log block 500 is composed plural FH MLC blocks 501~503 which use the fast pages and a data block 510 is composed of MLC blocks which use all of the fast and slow pages.

The log block 500 is organized such that a pair of the FH MLC blocks (e.g., 501) makes up a unit. The MLC blocks using the fast pages may be allocated to one data block with each unit by two thereof. This is because the MLC blocks only with the fast pages use their half spaces, for data storage, relative to those using all of pages.

The data block 510 is allocated with MLC blocks simultaneously using the fast and slow pages. Data buffered in the log block 500 are copied into the MLC blocks of the data block 510 by way of a merged operation.

Such an organization with the MLC blocks enables even a flash memory device, which supports operations only with MLCs, to be operable in fast writing operations.

Figure 11A:
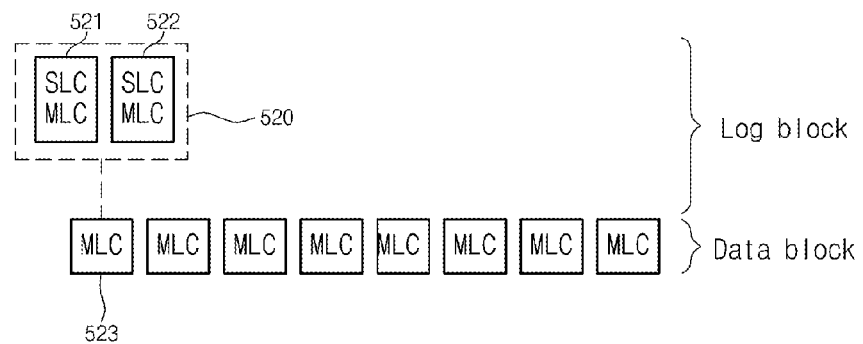
FIG. 11A is a schematic diagram for describing a 1:2 mapping scheme according to another embodiment of the present invention.
Figure 11B:
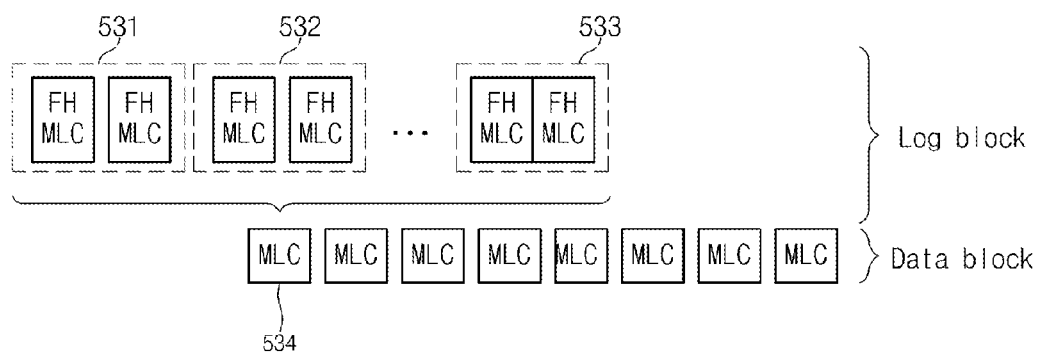
FIG. 11B is a schematic diagram for describing a 1:N mapping scheme according to another embodiment of the present invention.

FIGS. 11A and 11B are schematic diagrams illustrating structures of the log and data blocks corresponding to a single logical block under the block allocation scheme shown in FIG. 10.

Referring to FIG. 11A, the single logical block is allocated with the log block by two KH MLC blocks 521 and 522 and with the data block by an MLC block 523. Fast pages included in the two FH MLC blocks 521 and 533 are correspondent to the data storage capacity of one MLC block. This allocation protocol is preferred as a mapping scheme suitable for the case where a writing pattern requested from a file system is ascertained as a random-writing pattern (i.e., out-place order), which is referred to as a 1:2 mapping scheme.

Referring to FIG. 11B, one logical block is allocated with a log block of fast blocks 531, 532, and 533 each of which is composed of two FH MLC blocks. Further, a data block is allocated with one MLC block 534. This allocation protocol is referred to as a 1:N mapping scheme. Here, N denotes the number of blocks summing up the log and data blocks.

Figure 12:
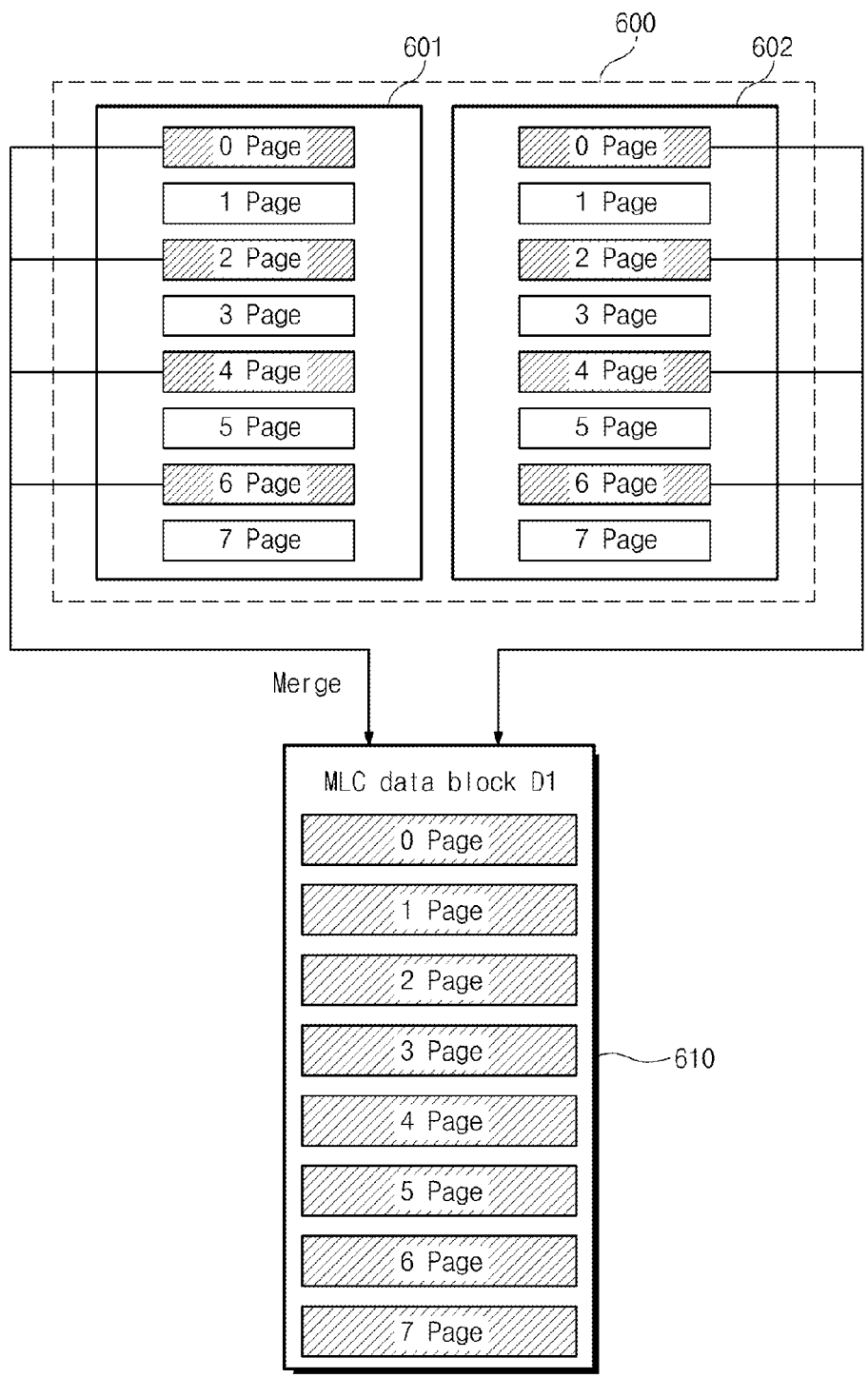
FIG. 12 is a schematic diagram for describing a merged operation in a random-writing pattern.

FIG. 12 is a schematic diagram illustrating a merged operation in the random-writing pattern. Analysis for confirming the ransom and sequential-writing patterns complies with the algorithm aforementioned in conjunction with FIG. 5. Referring to FIG. 12, when the FTL estimates a current writing pattern is in the out-place order (i.e., the random-writing pattern), a log block 600 is allocated with fast pages of the FH MLC block.

Data recorded in fast pages of the log block 600 are copied into fast and slow pages of a data block 610 during the merged operation. Page data requested for writing are written into fast pages (hatch-marked pages in FIG. 12) of the FH MLC blocks 601 and 602 of the log block 600. Slow pages are excluded from the log block as a write buffer. During a merged operation subsequent thereto, data of valid data, among page data written in the fast pages, are only copied into the data block 610 allocated thereto. The valid page data provided from the fast pages of the log block are sequentially programmed into the fast and slow pages of the data block 610 in a general MLC programming sequence.

Figure 13:
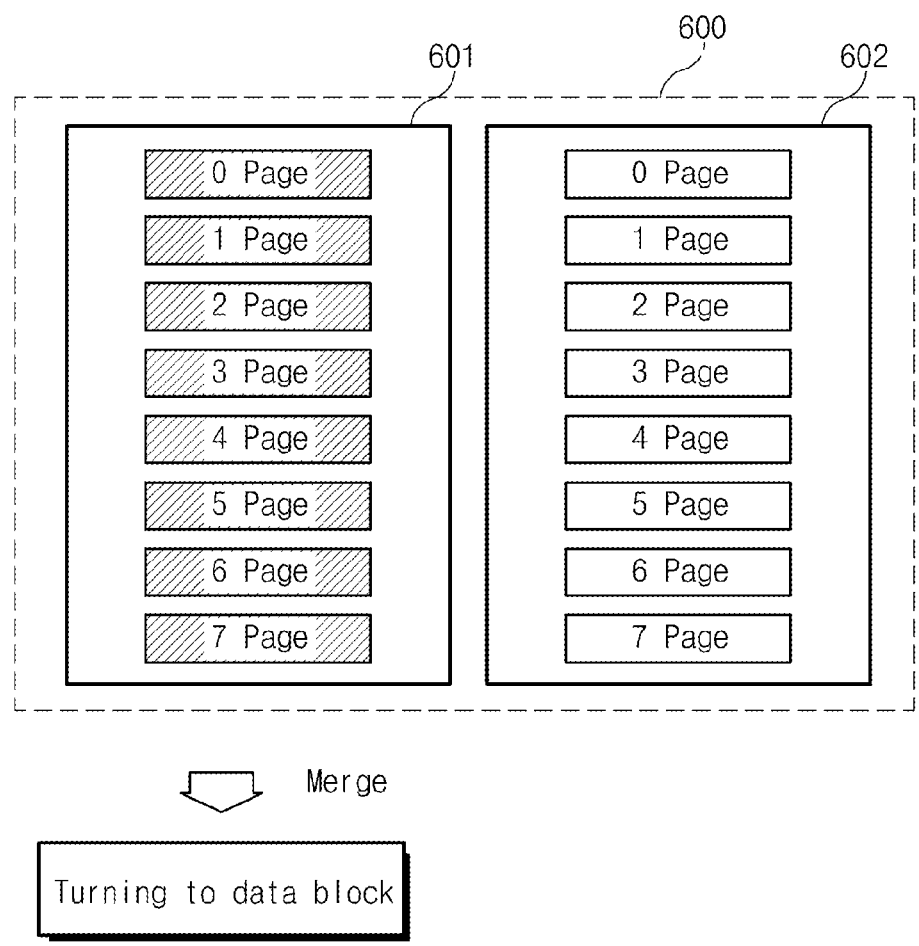
FIG. 13 is a schematic diagram for describing a merged operation in a sequential-writing pattern.

FIG. 13 is a schematic diagram for describing a merged operation in the sequential-writing pattern. The log block 600 is allocated with an MLC block using all of fast and slow pages, not an FH MLC block just using fast pages. Further, after completely writing data in the log block of the MLC block 601, the MLC block 601 is swapped into the data block from the log block in mapping information.

Figure 14A:
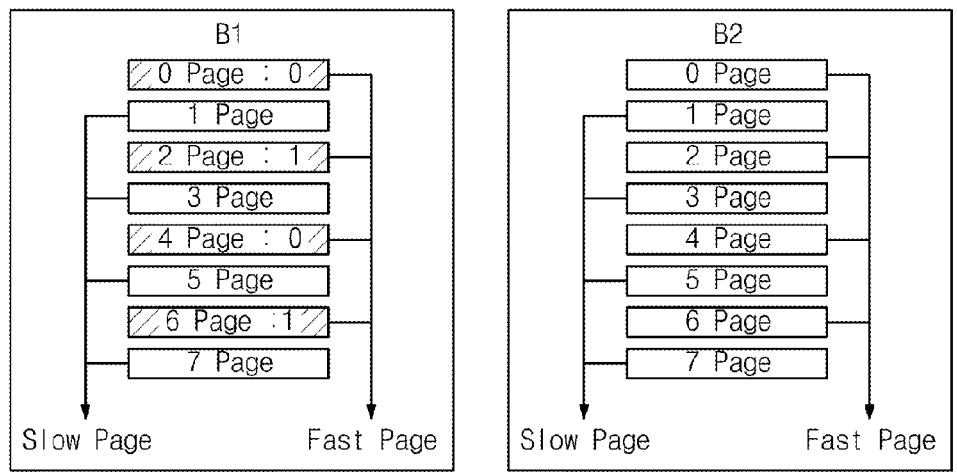
FIGS. 14A and 14B are schematic diagrams for describing operating a log block in accordance with embodiments of the present invention.
Figure 14A:
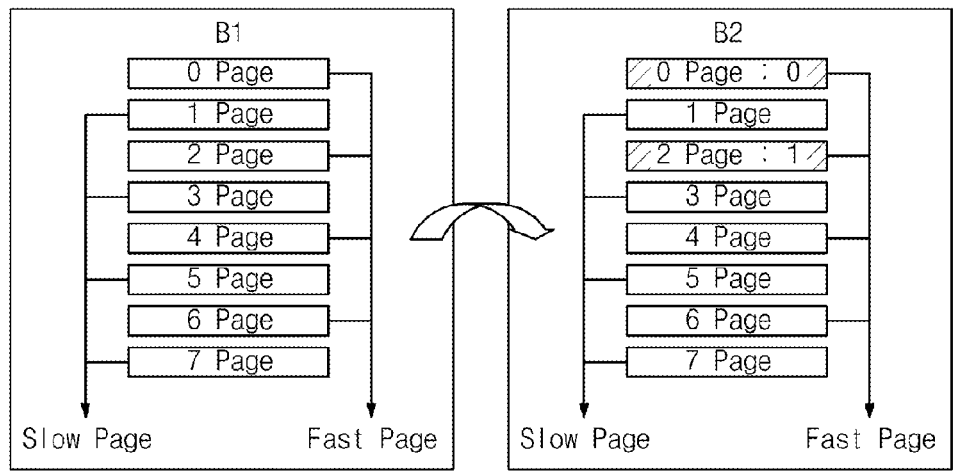
Figure 14B:
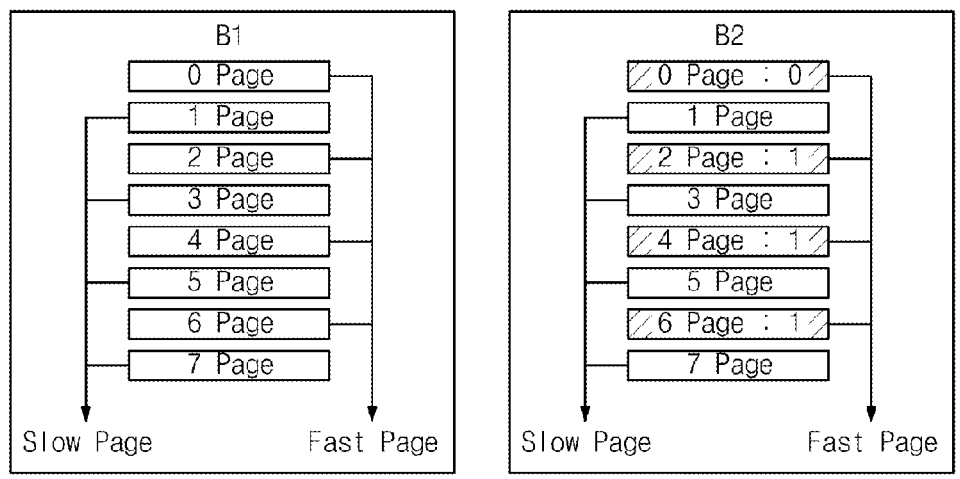
Figure 14B:
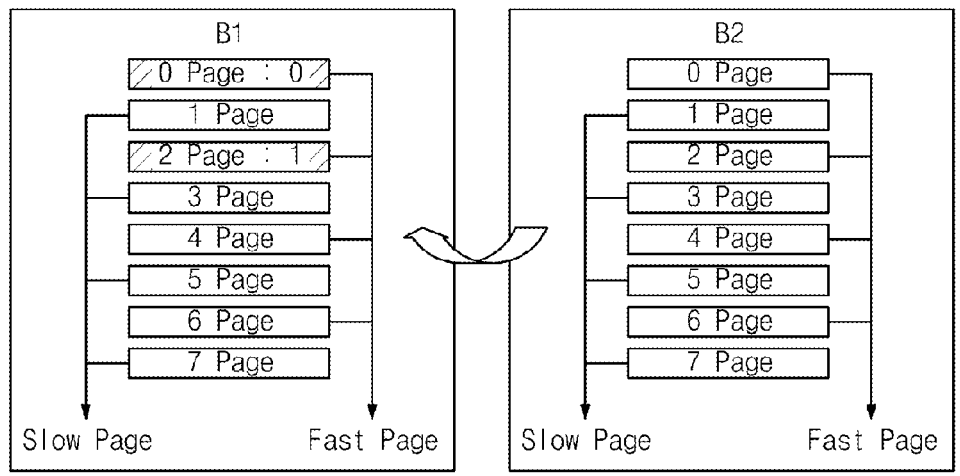

FIGS. 14A and 14B are schematic diagrams sequentially illustrating features of operating the log block, minimizing the number of merged operations from the log block into the data block. In particular, the number of merged operation cycles may be minimized in repeatedly allocating a specific page to the log block. The manner of operating the log block will be described through steps (1)~(4) with reference to FIGS. 14A and 14B.

Step (1) is relevant to an operation of the write buffer to a FH MLC block B1. If a request for writing from the file system is generated in the sequence of pages 0→1→0→1, this means that a current writing mode is the random-writing pattern. Thus, the log block is allocated with two FH MLC blocks. In a case of writing pattern with frequent over-writings, only the two pages (e.g., the pages 4 and 6) updated last are regarded as being valid. If the fast pages 0, 2, 4, and 6 of the block B1 are all used for the allocation, it counts the number of valid pages. If the number of valid pages is less than a half of the used page number, the valid pages may be identified as a pattern with frequent over-writings.

Being identified as a frequently overwriting pattern, only the valid patterns of the FH MLC block B1 are copied into an FH MLC block B2. This operation is carried out in step (2).

Next, in step (3), the log block is formed by using only fast pages to pages (0 and 2) into which valid data are copied from the previous FH MLC block B1 in the FH MLC block B2. In other words, block allocation of the FH MLC block B2 proceeds in the sequence of page 1->page 1->page 1, it accounts the number of pages from the time of filling the fast pages and the pages may be identified as being in the overwriting pattern. Further, only the valid page data are copied into the FH MLC block B1. This operation is correspondent with step (4). Such a data transfer operation with valid page data between the log blocks continues until the number of valid pages are filled up to make it impossible therebetween.

The aforementioned mode of operating the log blocks for write buffers may be a called ping-pong log block operation scheme. This ping-pong log block operation scheme is useful for frequent overwriting operations, e.g., updating cluster allocation information (FAT), directory entry, or data base file in a file system. In generally operating log blocks for write buffers, there are generated unnecessary page copying and erasing steps due to the large number of merged operations, which can adversely affect performance However, the ping-pong log block operation scheme according to the embodiment of the present invention is able to substantially reduce the number of page copying and erasing cycles, greatly improving the writing performance Throughout the aforementioned operations for writing data under the log block mapping scheme by embodiments of the present invention, the number of pages included in blocks is exemplarily shown in convenience of description, not restrictive hereto. The log block mapping and operation scheme according to embodiments of the present invention is advantageous to enhance a speed in writing data in a flash memory system using multi-level cells.

In summary, embodiments of the present invention provide a flash memory device or system, which employs an MLC array, with an advanced mapping and managing schemes for log blocks as write buffers.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of writing write data in flash memory, the method comprising:

receiving the write data and logical page addresses for the write data from a host;

writing the write data at a single-level cell SLC block if a writing pattern is a random-writing pattern;

writing the write data at a multi-level cell MLC block if the writing pattern is a sequential-writing pattern; and merging the write data written in the single-level cell SLC block into another multi-level cell MLC block associated with the logical page addresses wherein the writing pattern is determined based on a continuity of the logical page addresses for the write data.

2. The method of claim 1, wherein when at least two single-level cell SLC blocks are fully programmed with the write data, a valid portion of the write data in the at least two single-level cell SLC blocks is copied into the other multi-level cell MLC block.

3. The method of claim 1, wherein each of the single-level cell SLC block and the multi-level cell MLC block is included in a separated cell array of the flash memory.

4. The method of claim 1, wherein when the logical page addresses are continuous, the write data is written at the multi-level cell MLC block, and wherein when the logical page addresses are discontinuous, the write data is written at the single-level cell SLC block.

5. The method of claim 4, wherein a determination of whether the logical page addresses are continuous or discontinuous is performed by the host.

6. The method of claim 1, wherein the single-level cell SLC block and the multi-level cell MLC block are disposed in a same cell array of the flash memory, and are distinct from each other by designated operation mode.

7. The method of claim 6, wherein the single-level cell SLC block corresponds to a memory block that is configured to use a logical page other than a most significant MSB page of the memory block.

8. The method of claim 6, wherein the multi-level cell MLC block corresponds to a memory block being configured to use all the logical pages of the memory block.

9. A method of writing data in a flash memory device, the method comprising:

receiving the data and logical page addresses for the data;

determining a writing pattern of the data based on continuity of the logical page addresses;

writing the data into fast pages of a first block if the writing pattern is a random-writing pattern; and writing the data into fast pages and slow pages of a second block if the writing pattern is a sequential-writing pattern, wherein a time for writing the slow pages is longer than a time for writing the fast pages, wherein the first block and the second block are multi-level cell MLC blocks, and wherein the method further comprises:

selecting at least one valid portion of the data in the first block or the second block; and copying the at least one valid portion of the data to fast pages and slow pages of a third block.

10. The method of claim 9, wherein the fast pages correspond to a least significant LSB page and the slow pages correspond to a most significant bit MSB page.

11. The method of claim 9, wherein the first block and the second block correspond to a log block, and the third block corresponds to a data block being associated with the logical page addresses.

12. The method of claim 9, wherein the logical page addresses are mapped with a physical page addresses by a log mapping scheme.

13. A storage device, comprising:
a flash memory device including a single-level cell SLC block and a multi-level cell MLC block; and
a memory controller configured to receive write data and logical page addresses from an external device and further configured to program the write data into a storage field corresponding to the logical page addresses,
wherein the memory controller is configured to determine a writing pattern of the write data based on a continuity of the logical page addresses, and the memory controller is configured to program the write data into one of the single-level cell SLC block or the multi-level cell MLC block in accordance with the determined writing pattern,
wherein when the logical page addresses are discontinuous, the memory controller programs the write data into the single-level cell SLC block, and
wherein the write data written in the single-level cell SLC block is merged into another multi-level cell MLC block in connection with the logical page addresses.

14. The device of claim 13, wherein when the logical page addresses are continuous, the memory controller programs the write data into the multi-level cell MLC block.

15. The device of claim 13, wherein the single-level cell SLC block corresponds to a log block of the logical page addresses, and the other multi-level cell MLC block corresponds to a data block of the logical page addresses.

\* \* \* \* \*